US008772075B2

(12) United States Patent
Cho et al.

(10) Patent No.: US 8,772,075 B2
(45) Date of Patent: Jul. 8, 2014

(54) OLED TOUCH PANEL AND METHOD OF FORMING THE SAME

(75) Inventors: An-Thung Cho, Hsin-Chu (TW);
Jung-Yen Huang, Hsin-Chu (TW);
Chia-Tien Peng, Hsin-Chu (TW);
Chun-Hsiun Chen, Hsin-Chu (TW);
Wei-Ming Huang, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 1154 days.

(21) Appl. No.: 12/717,938

(22) Filed: Mar. 4, 2010

(65) Prior Publication Data

US 2011/0037729 A1 Feb. 17, 2011

(30) Foreign Application Priority Data

Aug. 14, 2009 (TW) .............................. 98127379 A (51) Int. Cl.
*H01L 21/00* (2006.01)
(52) U.S. Cl.
USPC ................. 438/82; 438/96; 438/97; 257/414; 257/432; 257/466; 345/175
(58) Field of Classification Search
USPC ............... 257/432, 466, 414; 438/82, 96, 97; 345/175
See application file for complete search history.

(56) References Cited

U.S. PATENT DOCUMENTS

| | | | |
|---|---|---|---|
| 5,663,576 A | 9/1997 | Shimizu | |
| 6,724,012 B2 | 4/2004 | Kimura | |
| 2002/0079512 A1 | 6/2002 | Yamazaki | |
| 2006/0180816 A1* | 8/2006 | Li et al. ........................... | 257/79 |
| 2007/0241333 A1* | 10/2007 | Park et al. ....................... | 257/61 |
| 2008/0150848 A1* | 6/2008 | Chung et al. .................... | 345/82 |
| 2008/0179462 A1* | 7/2008 | Murphy ......................... | 244/143 |
| 2008/0179762 A1* | 7/2008 | Cho et al. .............. | 257/E31.001 |
| 2008/0272689 A1* | 11/2008 | Ide et al. ....................... | 313/504 |
| 2009/0283850 A1 | 11/2009 | Cho | |

FOREIGN PATENT DOCUMENTS

| | | |
|---|---|---|
| CN | 101211246 A | 7/2008 |
| CN | 101276828 A | 10/2008 |
| CN | 101593785 A | 12/2009 |
| TW | 200832516 | 8/2008 |

OTHER PUBLICATIONS

Cho et al., Title of Invention:Photo Sensor, Method of Forming the Same, and Optical Touch Device,U.S. Appl. No. 12/718,998, filed Mar. 7, 2010.

* cited by examiner

*Primary Examiner* — Matthew Reames
*Assistant Examiner* — Farid Khan
(74) *Attorney, Agent, or Firm* — Winston Hsu; Scott Margo (57) ABSTRACT

A display region and a light sensing region are defined in each pixel region of the OLED touch panel of the present invention. The readout thin film transistor of the light sensing region is formed by the same processes with the drive thin film transistor of the display region. The top and bottom electrodes of the optical sensor are formed by the same processes with the top and bottom electrodes of the OLED. Accordingly, the present invention can just add a step of forming the patterned sensing dielectric layer to the processes of forming an OLED panel to integrate the optical sensor into the pixel region of the OLED panel. Thus, an OLED touch panel is formed.

17 Claims, 9 Drawing Sheets

OLED TOUCH PANEL AND METHOD OF FORMING THE SAME

BACKGROUND OF THE INVENTION

1. Field of the Invention

The present invention relates to an organic light emitting display device, and more particularly, to an organic light emitting diode touch panel and a method of making the same.

2. Description of the Prior Art

An organic light emitting diode (OLED) is a current driving device. The light emitting brightness of the OLED depends on the current passing through the device. Currently, the OLED in a matrix array display panel is controlled by the driving current of the OLED to achieve the effect of different brightness (i.e. gray value). The OLED has advantages such as power saving, miniaturization, lower manufacturing cost, a wider view angle, a shorter response time, and a wider range of operated temperature. As a result, the OLED has great potential in a flat display device.

SUMMARY OF THE INVENTION

It is therefore one objective of the present invention to provide an OLED touch panel and a method of making the same to effectively integrate the touch panel into the OLED display device.

According to the present invention, a method of forming an OLED touch panel is provided. The method includes the following steps. First, a substrate is provided, at least a pixel region is defined on the substrate, and a display region and a light sensing region are defined in the pixel region. Then, a first thin film transistor and a second thin film transistor is formed in the display region of the substrate and in the light sensing region of the substrate respectively. Subsequently, a first conductive film is formed on the first thin film transistor and the second thin film transistor, and the first conductive film is patterned to form a first bottom electrode and a second bottom electrode, wherein the first bottom electrode and the second bottom electrode are located in the display region and in the light sensing region respectively, and the first bottom electrode and the second bottom electrode are electrically connected to the first thin film transistor and the second thin film transistor respectively. Following that, a patterned organic light emitting layer is formed on the first bottom electrode, and a patterned light sensing dielectric layer is formed on the second bottom electrode. Then, a second conductive film is formed on the patterned organic light emitting layer and the patterned light sensing dielectric layer, and the second conductive film is patterned to form a first top electrode and a second top electrode, wherein the first top electrode and the second top electrode are located on the patterned organic light emitting layer and on the patterned light sensing dielectric layer respectively.

According to the present invention, an OLED touch panel is provided. The OLED touch panel includes a substrate, an OLED, and an optical sensor. At least a pixel region is defined on the substrate, and a display region and a light sensing region are defined in the pixel region. The OLED is disposed in the display region of the substrate, and the OLED includes a first thin film transistor, a first bottom electrode, a patterned organic light emitting layer, and a first top electrode. The first bottom electrode is disposed on the first light bottom electrode and electrically connected to the first thin film transistor. The patterned organic light emitting layer is disposed on the first bottom electrode. The first top electrode is disposed on the patterned organic light emitting layer. The optical sensor is disposed in the light sensing region of the substrate, and the optical sensor includes a second thin film transistor, a second bottom electrode, a patterned light sensing dielectric layer, and a second top electrode. The second bottom electrode is disposed on the second thin film transistor and electrically connected to the second thin film transistor. The patterned light sensing dielectric layer is disposed on the second bottom electrode. The second top electrode is disposed on the patterned light sensing dielectric layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
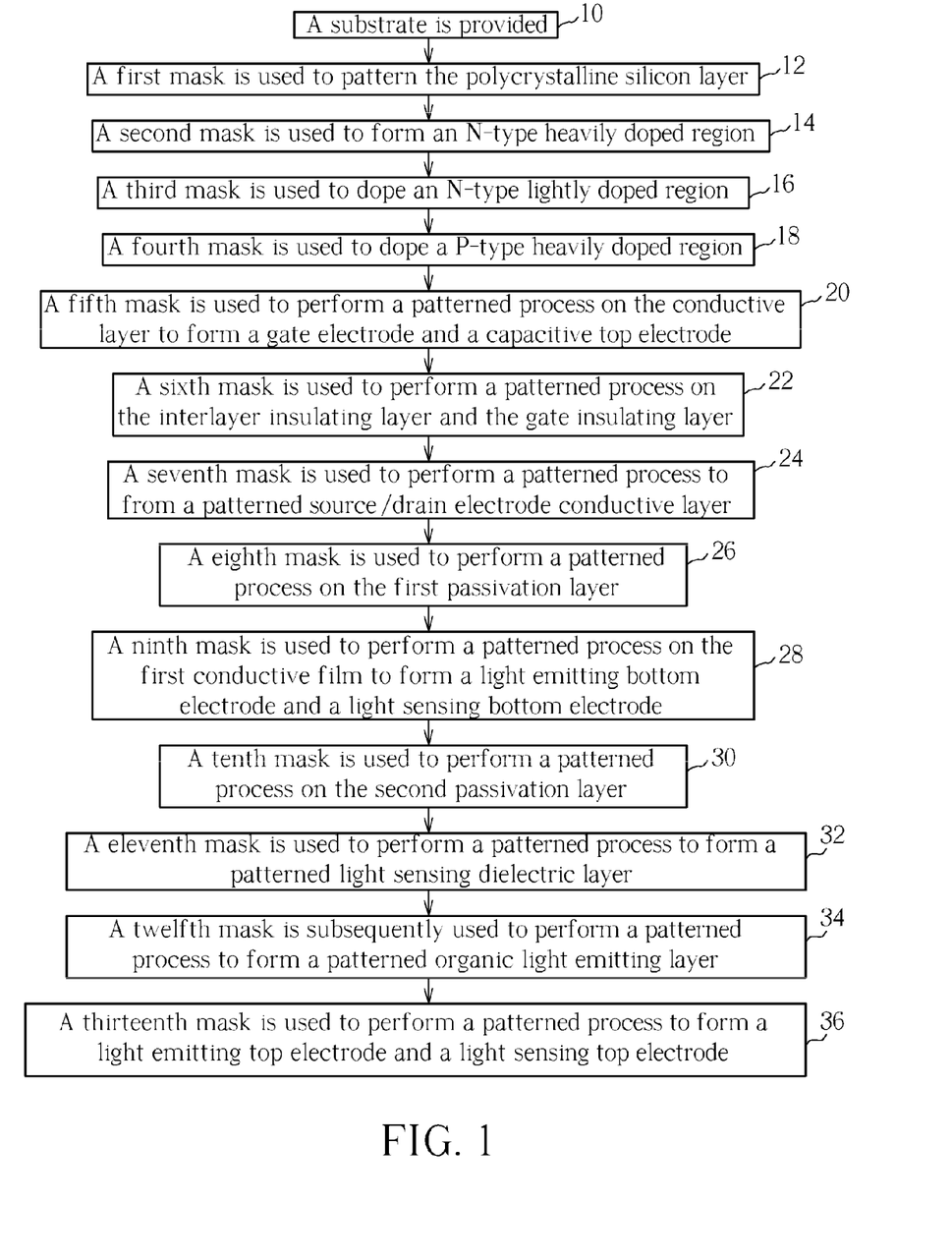
FIG. 1 is a flowchart illustrating a method of forming an OLED touch panel according to a first preferred embodiment of the present invention.
Figure 2:
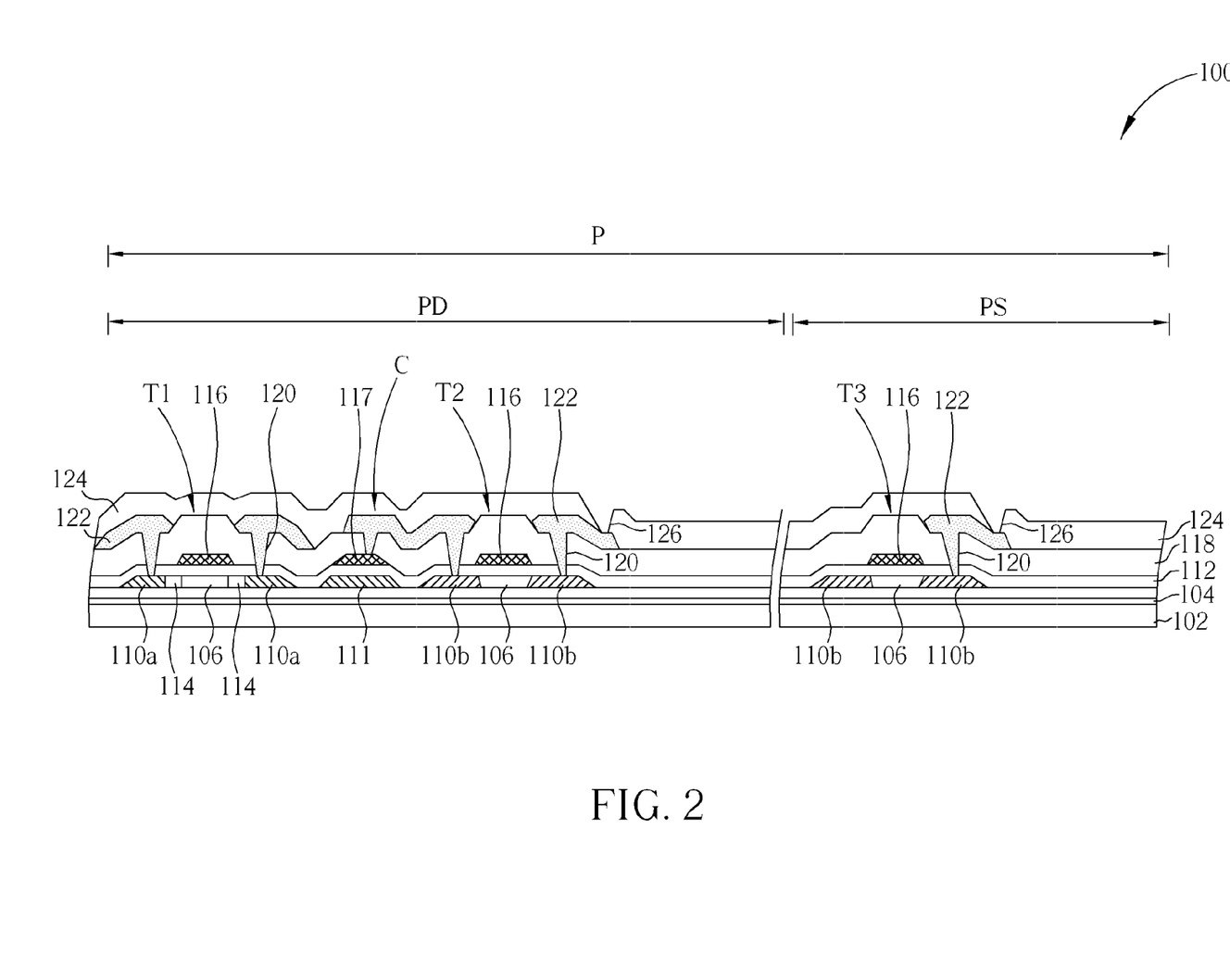
FIGS. 2-4 are schematic diagrams illustrating a method of forming an OLED touch panel according to a first preferred embodiment of the present invention.
Figure 3:
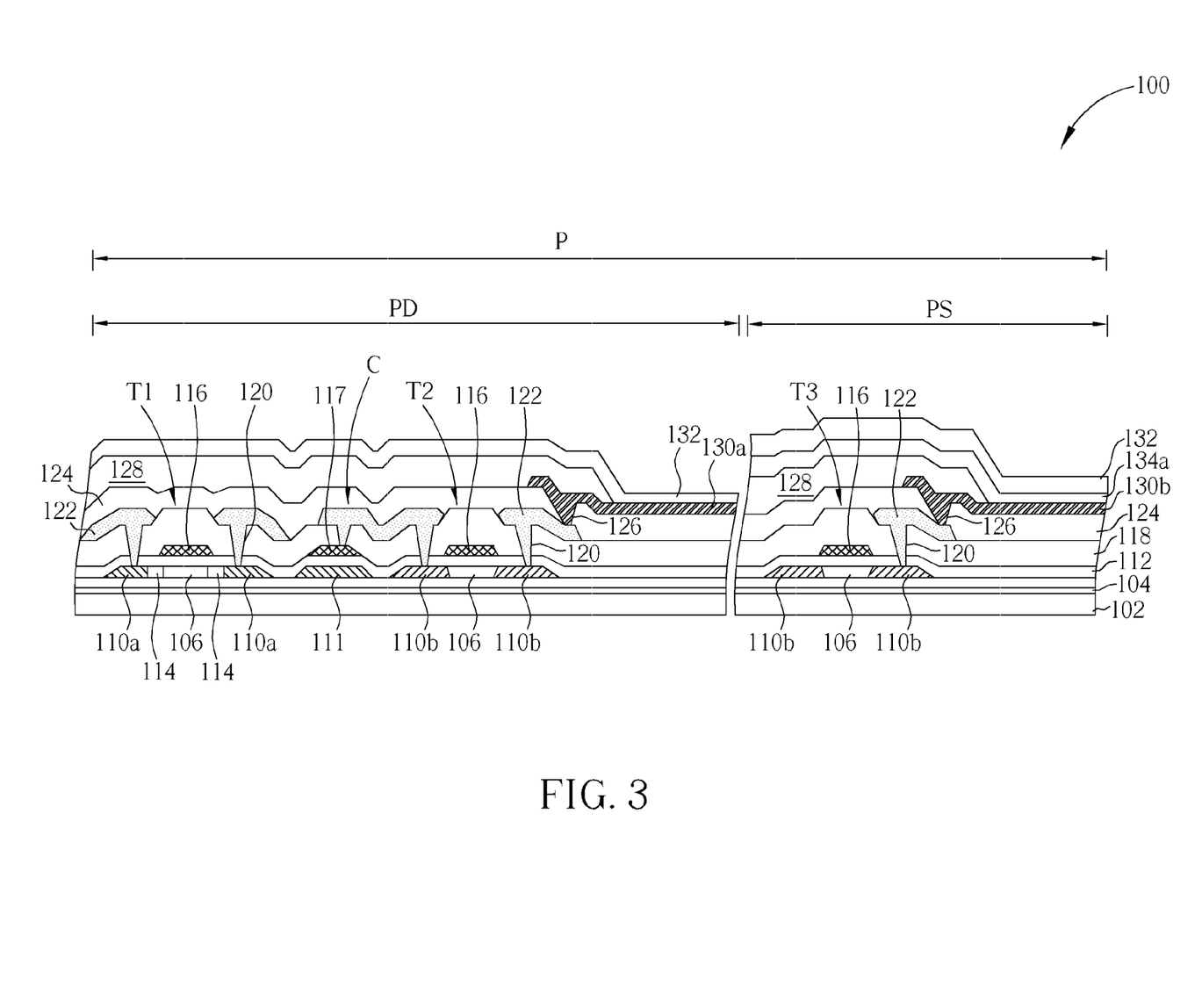
Figure 4:
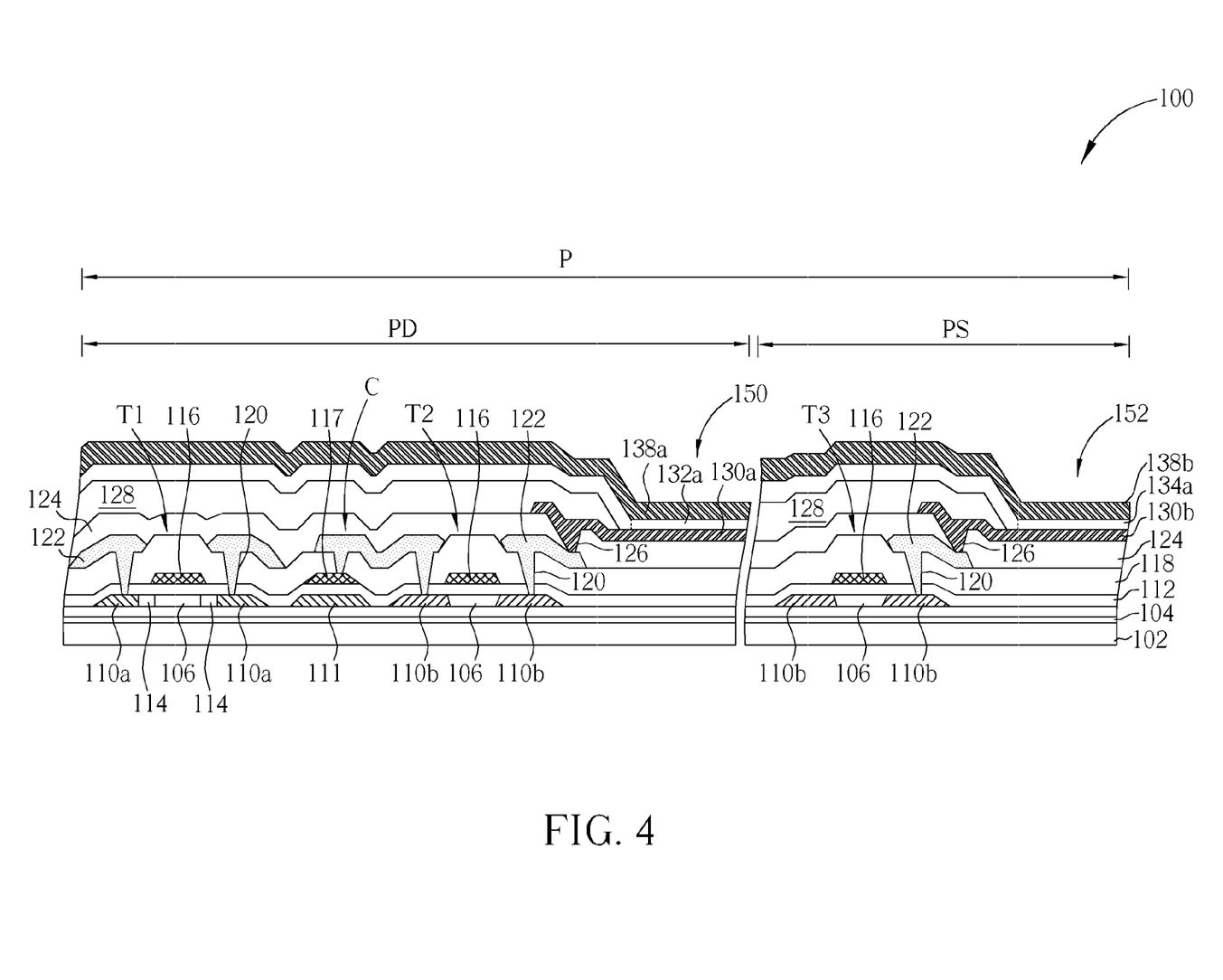

FIG. 1 is a flowchart illustrating a method of forming an OLED touch panel according to a first preferred embodiment of the present invention. FIGS. 2-4 are schematic diagrams illustrating a method of forming an OLED touch panel according to a first preferred embodiment of the present invention. The same device or the same region is indicated as the same symbol. It should be noted that the diagrams are only for explanations and are not drawn as original sizes or to scale.

As shown in FIG. 1 (from step 10 to step 26) and in FIG. 2, a substrate 102, such as a transparent glass substrate, is provided first to serve as a bottom substrate, and a buffer layer 104 is formed on the substrate 102. A plurality of pixel regions P arranged in matrix may be defined on the substrate 102, and display regions PD and light sensing regions PS are defined in the pixel regions P. Only a single pixel region P is illustrated in the figure. Before or after the forming of the buffer layer 104, a black matrix layer (not shown in the figure) may be formed on the substrate 102. Then, an amorphous silicon (a-Si) layer (not shown in the figure) is deposited on the buffer layer 104, and the amorphous silicon layer can be recrystallized to become the polycrystalline silicon layer by an annealing process such as an excimer laser treatment. Subsequently, a first mask is used to pattern the polycrystalline silicon layer. For example, a photoresist layer may be formed first on the substrate 102, a lithographic process may be performed on the photoresist layer to form a patterned photoresist, and the patterned photoresist may serve as an etching mask to etch the polycrystalline silicon layer. The required pattern of the patterned polycrystalline silicon layer 106 after removing the patterned photoresist may serve as a semiconductor layer of a thin film transistor and a semiconductor layer of a capacitance device C.

Following that, a second mask is used to form an N-type heavily doped region (N+ region). For example, a photoresist layer may be formed first on the substrate 102, a lithographic process may be performed on the photoresist layer to form a patterned photoresist, and the patterned photoresist may serve as a doping mask to perform a doping process. Then, the patterned photoresist is removed to form a source/drain electrode 110*a* and a capacitive bottom electrode 111 in the patterned polycrystalline silicon layer 106 of the N-type metal oxide semiconductor transistor (NMOS) and the capacitance device C. For example, the source/drain electrode 110*a* may be formed in the first thin film transistor T1. A gate insulating layer 112 is formed to cover the patterned polycrystalline silicon layer 106 and the substrate 102, and a third mask is used to dope an N-type lightly doped region (N− region) to form a source/drain electrode lightly doped region 114 in the first thin film transistor T1. Subsequently, a fourth mask is used to dope a P-type heavily doped region (P+ region) to form a source/drain electrode 110*b* in the patterned polycrystalline silicon layer 106 of the P-type metal oxide semiconductor transistor (PMOS). For example, the P-type source/drain electrode 110*b* may be formed in the second thin film transistor T2 and the third thin film transistor T3.

Then, a conductive layer, such as a metal layer, is formed on the surface of the gate insulating layer 112, and a fifth mask is used to perform a patterned process on the conductive layer to form a gate electrode 116 and a capacitive top electrode 117. Subsequently, an interlayer insulating layer (ILD) 118 is deposited to cover the gate electrode 116 and the gate insulating layer 112, and a sixth mask is used to perform a patterned process for etching the interlayer insulating layer 118 and the gate insulating layer 112 until reaching the surface of the source/drain electrodes 110*a* and 110*b* to form a plurality of first via holes 120. Following that, a metal deposition process is performed, and a seventh mask is used to perform a patterned process to from a patterned source/drain electrode conductive layer 122. A portion of the patterned source/drain electrode conductive layer 122 may be in the first via holes 120 for electrically connecting to the source/drain electrodes 110*a* and 110*b*. Then, a first passivation layer 124 is formed on the patterned source/drain electrode conductive layer 122 and the interlayer insulating layer 118, and an eighth mask is used to perform a patterned process for etching the first passivation layer 124 to form a plurality of second via holes 126 on the patterned source/drain electrode conductive layer 122.

As a result, the capacitance device, the first thin film transistor T1, and the second thin film transistor T2, and the third thin film transistor T3 can be formed on the substrate 102, wherein the first thin film transistor T1 and the second thin film transistor T2 are located in the display region PD to serve as a switch thin film transistor (switch TFT) and a drive thin film transistor (drive TFT) respectively, and the third thin film transistor T3 is located in the light sensing region PS to serve as a readout thin film transistor (readout TFT). The first/second/third thin film transistor T1/T2/T3 of this embodiment is a low temperature polycrystalline silicon (LTPS) thin film transistor, but it is not limited herein.

As shown in FIG. 1 (from step 28 to step 32) and in FIG. 3, a first conductive film is then formed on the passivation layer 124, and a ninth mask is used to perform a patterned process on the first conductive film to form a first bottom electrode 130*a* and a second bottom electrode 130*b*. The first bottom electrode 130*a* may serve as an anode electrode of the OLED. The first bottom electrode 130*a* is located in the display region PD and is electrically connected to the source/drain electrode 110*b* of the second thin film transistor T2 by the patterned source/drain electrode conductive layer 122. The second bottom electrode 130*b* is located in the light sensing region PS and is electrically connected to the source/drain electrode 110*b* of the third thin film transistor T3 by the patterned source/drain electrode conductive layer 122. Then, a second passivation layer 128 is formed completely on the substrate 102, and a tenth mask is used to perform a patterned process on the second passivation layer 128 until the exposure of the first bottom electrode 130*a* and the second bottom electrode 130*b*. In this embodiment, a light sensing dielectric layer can be formed first, an eleventh mask is used to perform a patterned process to form a patterned light sensing dielectric layer 134*a* on the second bottom electrode 130*b*, and an organic light emitting layer 132 is then formed completely.

As shown in FIG. 1 (from step 28 to step 32) and in FIG. 4, a twelfth mask is subsequently used to perform a patterned process on the organic light emitting layer 132 to form a patterned organic light emitting layer 132*a* on the first bottom electrode 130*a*. Then, a second conductive film is formed on the patterned organic light emitting layer 132*a* and the patterned light sensing dielectric layer 134*a*. A thirteenth mask is used to perform a patterned process on the second conductive film to form a first top electrode 138*a* and a second top electrode 138*b*, and the OLED touch panel 100 of this embodiment is finished. Furthermore, in order to avoid water erosion, a passivation layer (not shown in the figure) may be formed to cover the first top electrode 138*a* and the second top electrode 138*b*. The passivation layer, for example, may be a silicon oxide and/or silicon nitride layer formed by deposition technique or spin coating technique.

The first top electrode 138*a* and the second top electrode 138*b* may be located on the patterned organic light emitting layer 132*a* and the patterned light sensing dielectric layer 134*a* respectively, and the first top electrode 138*a* may serve as a cathode electrode of the OLED. The first bottom electrode 130*a*, the patterned organic light emitting layer 132*a*, and the first top electrode 138*a* may form the OLED 150, and the second bottom electrode 130*b*, the patterned light sensing dielectric layer 134*a*, and the second top electrode 138*b* may form the optical sensor 152.

The patterned light sensing dielectric layer 134*a* is preferably, for the better sensing effect and stability, a silicon-rich dielectric layer, such as a silicon-rich oxide (SiOx) layer, a silicon-rich nitride (SiNy) layer, a silicon-rich oxynitride (SiOxNy) layer, a silicon-rich carbide (SiCz) layer, or a silicon-rich carbon oxide (SiOxCz) layer, wherein $0<x<2$, $0<y<1.33$, and $0<z<1$. The patterned light sensing dielectric layer 134*a* may be a microcrystalline silicon (micro-Si) layer, a nanocrystalline silicon (nano-Si) layer, a polycrystalline silicon layer, an amorphous silicon layer, or a stack layer of the aforementioned layers. The patterned organic light emitting layer 132*a* may be a single layer structure or a multilayer structure. For example, the multilayer structure may be sequentially a hole injection layer, a hole transport layer, an organic light emitting layer, and an electron transport layer. The hole injection layer and the hole transport layer, for example, may be formed by vacuum deposition technique, wherein the material of the hole injection layer may be m-MTDATA (4,4',4"-tris-(3-methylphenylphenylamino) triphenylamine), and the material of the hole transport layer may be NPB (an organic material containing nitrogen). The organic light emitting layer, for example, may be formed by vacuum deposition technique, and the material of the organic light emitting layer may be a doped organic material. The electron transport layer, for example, may be formed by vacuum deposition techniques, and the material of the electron transport layer may be an aluminum complex.

The optical sensor 152 with a silicon-rich dielectric layer can be successively integrated in the LTPS thin film transistor and the a-Si thin film transistor, and the silicon-rich dielectric layer can be deposited on the transparent electrode or the metal electrode by plasma-enhanced chemical vapor deposition (PECVD) techniques. The silicon atoms of the silicon-rich dielectric layer are excited by incident light to generate electron-hole pairs. Under the applied electric field, the electron-hole pairs are separated to generate photocurrents serving as sensing signals. The opto-electronic characteristics of the optical sensor 152 with a silicon-rich dielectric layer can be controlled to provide the better opto-electronic effect by adjusting factors such as the percentage of silicon of the silicon-rich dielectric layer and the thickness of the silicon-rich dielectric layer. Furthermore, since the optical sensor 152 can be disposed between the transparent electrodes or the metal electrodes, a metal-insulator-metal (MIM) stack structure can be integrated in the pixel readout circuit to increase the fill factor of the optical sensor 152.

Figure 5:
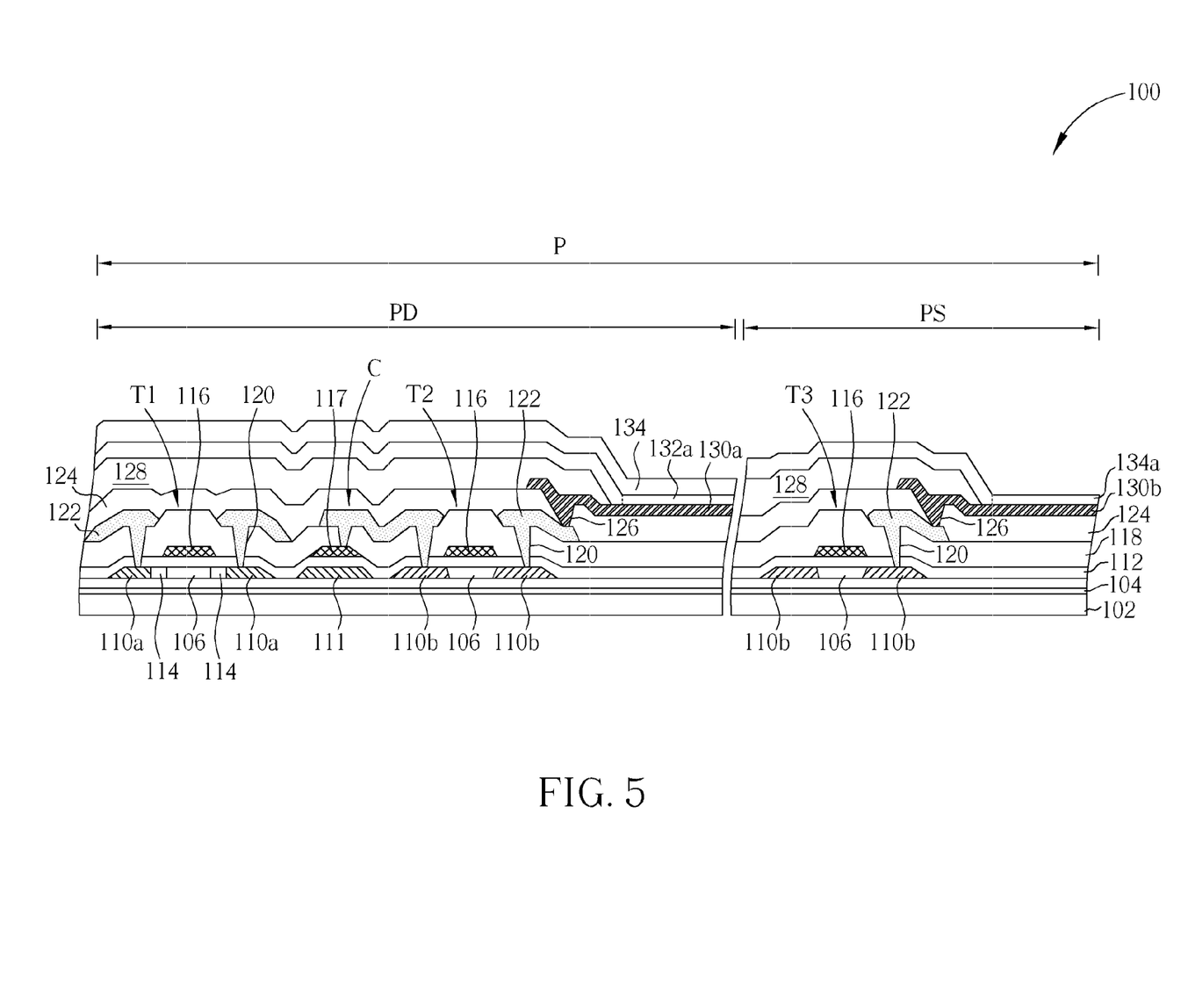
FIG. 5 schematically illustrates a method of forming an OLED touch panel according to a second preferred embodiment of the present invention.

In addition, in this invention, the patterned light sensing dielectric layer 134a can be formed after the forming of the patterned organic light emitting layer 132a. FIG. 5 schematically illustrates a method of forming an OLED touch panel according to a second preferred embodiment of the present invention. As shown in FIG. 5, in this embodiment, an organic light emitting layer is deposited first, the eleventh mask is then used to perform a patterned process to form a patterned organic light emitting layer 132a on the first bottom electrode 130a, and a light sensing dielectric layer 134 is deposited completely. Following that, the twelfth mask is used to perform a patterned process on the light sensing dielectric layer 134 to form a patterned light sensing dielectric layer 134a as shown in FIG. 4 on the second bottom electrode 130b.

Figure 6:
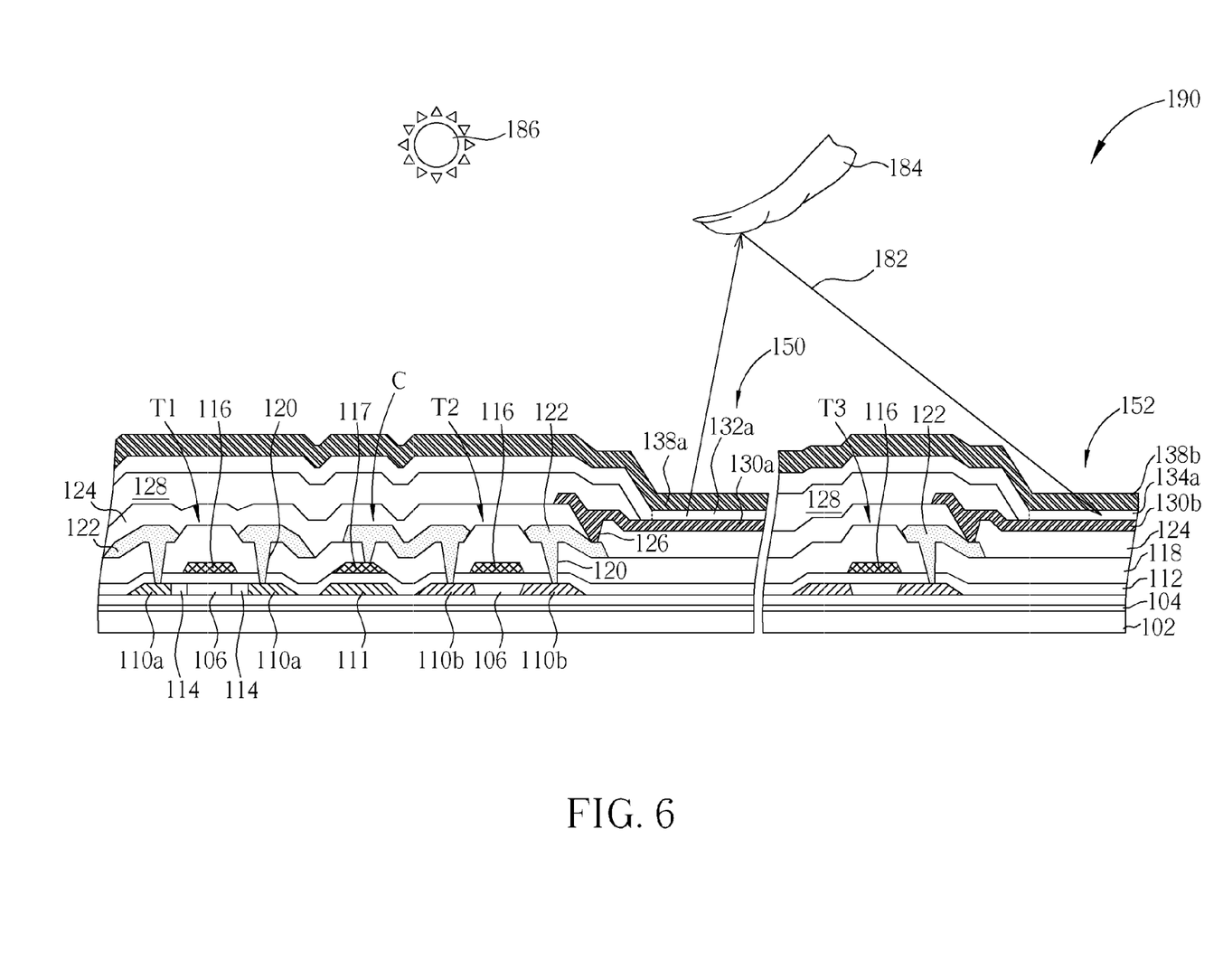
FIG. 6 schematically illustrates a top emitting OLED touch panel according to a third preferred embodiment of the present invention.
Figure 7:
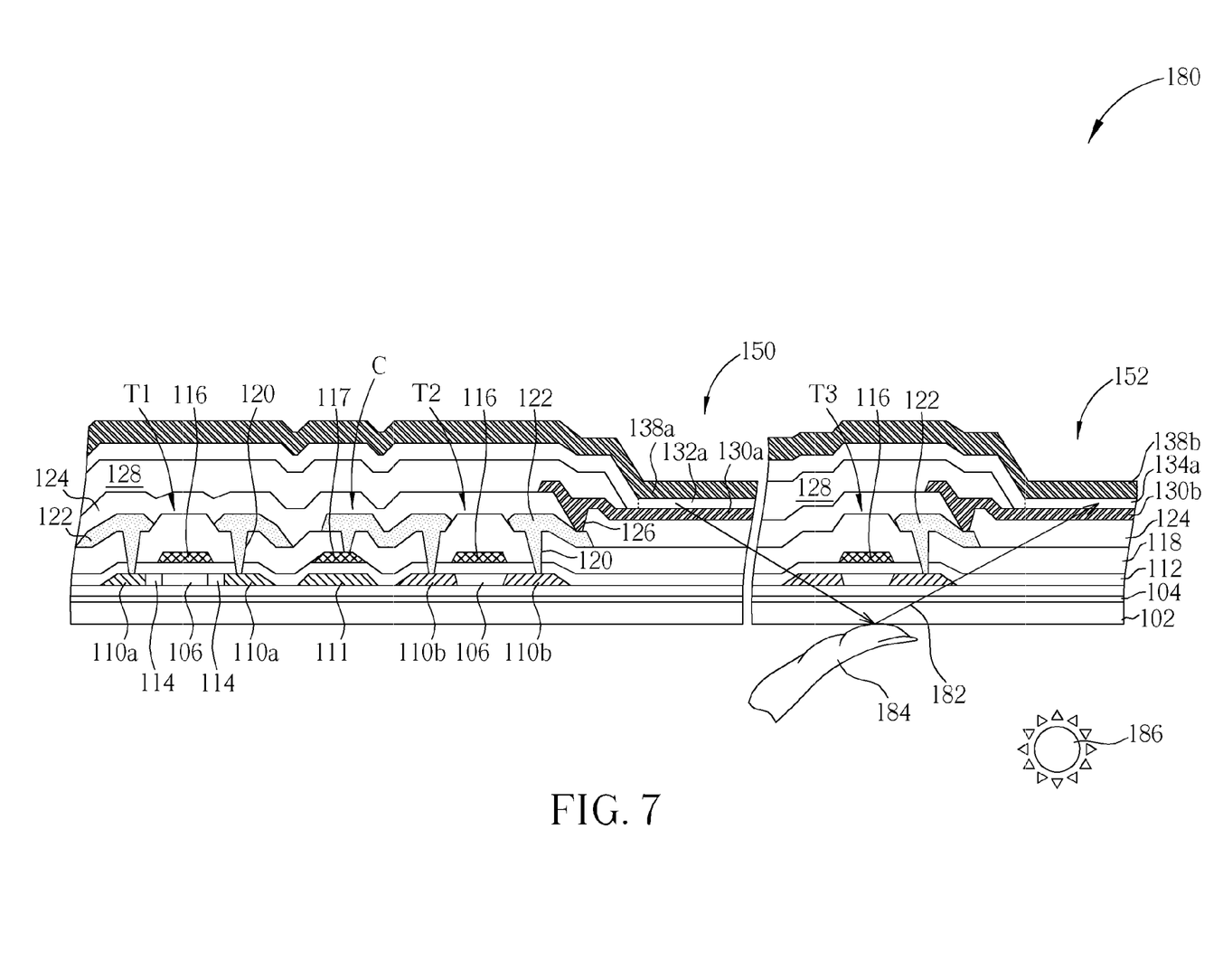
FIG. 7 schematically illustrates a bottom emitting OLED touch panel according to a fourth preferred embodiment of the present invention.

Based on the structure of the OLED, the OLED can be divided into two types. One is a top emitting OLED structure, and another is a bottom emitting OLED structure. FIG. 6 and FIG. 7 schematically illustrate a top emitting OLED touch panel 190 and a bottom emitting OLED touch panel 180 according to a third and a fourth preferred embodiment of the present invention respectively. As shown in FIG. 6, when the top emitting OLED touch panel 190 is produced, the aforementioned first conductive film, for example, may be a highly reflective metal conductive material formed by evaporation technique or sputtering technique, and the material of the first conductive film, for example, may be platinum (Pt), palladium (Pd), iridium (Ir), aurum (Au), tungsten (W), nickel (Ni), silver (Ag), or aluminum (Al). The aforementioned second conductive film, for example, may be a transparent conductive material film containing indium tin oxide (ITO) or indium zinc oxide (IZO). Accordingly, the light 182 of the top emitting OLED 150 can radiate out by passing through the transparent first top electrode 138a. When a touch object 184, such as a finger, approaches the top surface of the top emitting OLED touch panel 190, the light 182 radiating out from the OLED 150 is reflected by the touch object 184 and toward the light sensing region PS to be sensed by the optical sensor 152. The electron-hole pairs are excited in the optical sensor 152 to generate photocurrents, and the photocurrents can be transformed into the sensing signals by the third thin film transistor T3 (readout TFT). Furthermore, if the intensity of the ambient light 186 is high enough, then the approach of the touch object 184 will cover the ambient light 186 to decrease the photocurrents so that the touch position can be determined. The light radiating from the top emitting OLED touch panel 190 is less affected by the thin film transistor structure on the substrate 102, and the top emitting OLED touch panel 190 can have a larger aperture ratio.

As shown in FIG. 7, when the bottom emitting OLED touch panel 180 is produced, the aforementioned first conductive film may include a transparent conductive material, and the aforementioned second conductive film may include a highly reflective metal conductive material. Accordingly, the light 182 of the bottom emitting OLED 150 can radiate out by passing through the transparent first bottom electrode 130a. When a touch object 184 approaches the bottom surface of the bottom emitting OLED touch panel 180, the light 182 radiating out from the OLED 150 is reflected by the touch object 184 and toward the light sensing region PS to be sensed by the optical sensor 152. In the same way, if the intensity of the ambient light 186 is high enough, then the touch position can be determined by the decrement of the photocurrents.

According to the operation of the OLED touch panels of the third embodiment and the fourth embodiment, the optical sensor 152 in the light sensing region can serve as a touch sensing device to determine the touch position. In other embodiments, an ambient light sensor (ALS) can be added in the margin of the display region or outside the display region, and the structure of the ALS can be the same as the optical sensor 152. When the optical sensor 152 serves as the ambient light sensor, the brightness of the OLED touch panel 100 may be adjusted by detecting the brightness change of the ambient light 186. Furthermore, the ALS can also provide a reference signal to the touch sensor, so that the touch sensor can be adjusted appropriately to maintain the touch sensitivity according to the brightness of the ambient light.

Figure 8:
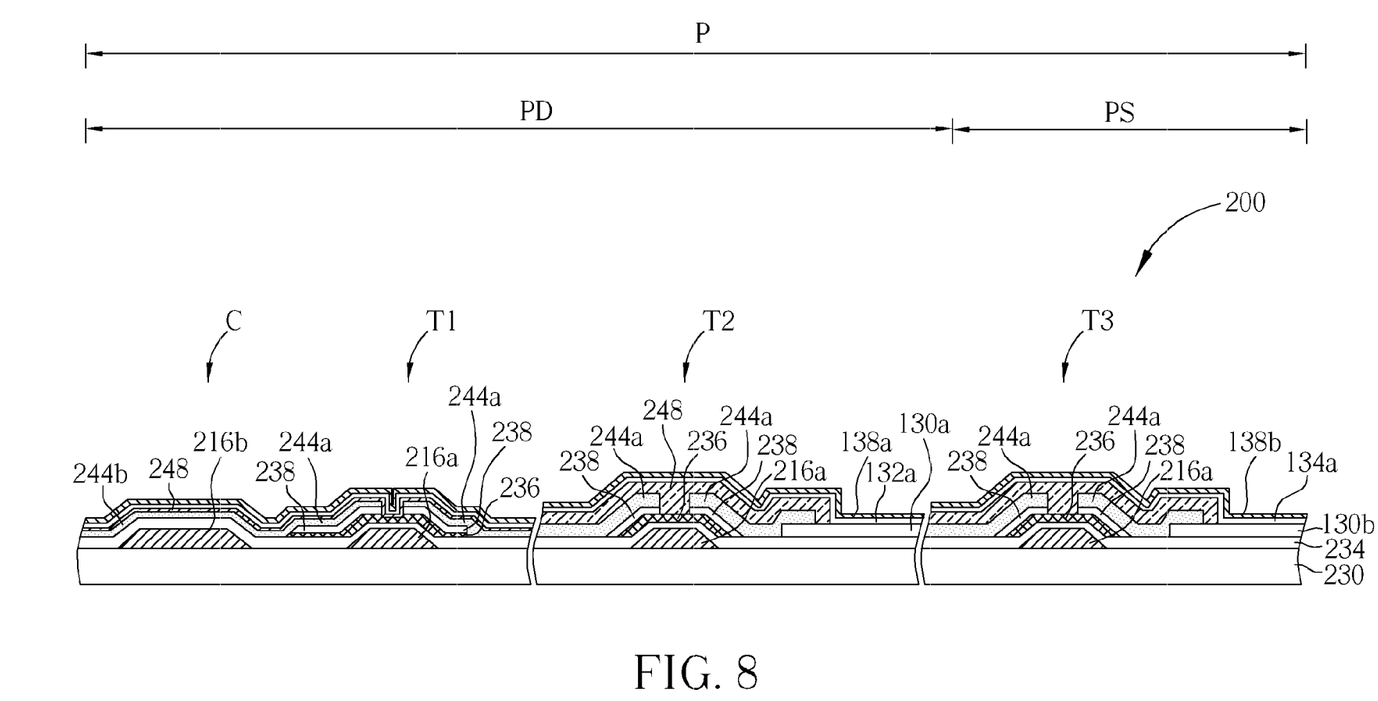
FIG. 8 schematically illustrates a method of forming an OLED touch panel according to a fifth preferred embodiment of the present invention.

In addition, the aforementioned embodiment is explained in the case of the LTPS thin film transistor, and the a-Si thin film transistor can also be combined into this invention in other embodiments. FIG. 8 schematically illustrates a method of forming an OLED touch panel 200 according to a fifth preferred embodiment of the present invention, and FIG. 8 also illustrates a structure of the OLED touch panel 200. As shown in FIG. 8, a conductive layer, such as a metal layer, is formed on the surface of the substrate 230. By using the first mask and the patterned process, the conductive layer is patterned to form a gate electrode 216a and a bottom electrode 216b of the capacitance device C in the display region PD and in the light sensing region PS. Then, a gate insulating layer 234, an amorphous silicon layer, and a doped amorphous silicon layer are formed sequentially on the surface of the gate electrode 216a, a bottom electrode 216b, and a substrate 230. Subsequently, by using the second mask and the patterned process, parts of the amorphous silicon layer and the doped amorphous silicon layer are removed to form an island structure on the predestined region of the first/second/third thin film transistor T1/T2/T3. The island structure includes the patterned amorphous silicon layer 236 and the patterned doped amorphous silicon layer.

Following that, a first conductive film, such as a transparent conductive film or a metal film, is formed completely on the surface of the substrate 230, and, by using the third mask and the patterned process, the first conductive film is defined to form a first bottom electrode 130a and a second bottom electrode 130b.

Then, another conductive layer is formed completely on the surface of the substrate 230, and the fourth mask is used to perform the patterned process on the conductive layer and the doped amorphous silicon layer, so that the conductive layer is defined to form a patterned source/drain electrode conductive layer 244a and a top electrode 244b of a capacitance device C. The doped amorphous silicon layer can become a source/drain electrode 238, and the exposed parts of the patterned amorphous silicon layer 236 serve as the channels of the first/second/third thin film transistor T1/T2/T3. Subsequently, a passivation layer 248 is formed on the whole surface of the substrate 230, and, by using the fifth mask, the passivation layer 248 in the display region PD is removed to form a patterned passivation layer on the patterned source/drain electrode conductive layer 244a. Thus, the a-Si thin film transistor process is finished.

Then, by using the steps as shown in FIGS. 2-4, a first bottom electrode 130a, a second bottom electrode 130b, a patterned organic light emitting layer 132a, a patterned light sensing dielectric layer 134a, a first top electrode 138a, a second top electrode 138b, and a passivation layer 290 are formed to finish the OLED touch panel 200 of this embodiment.

Figure 9:
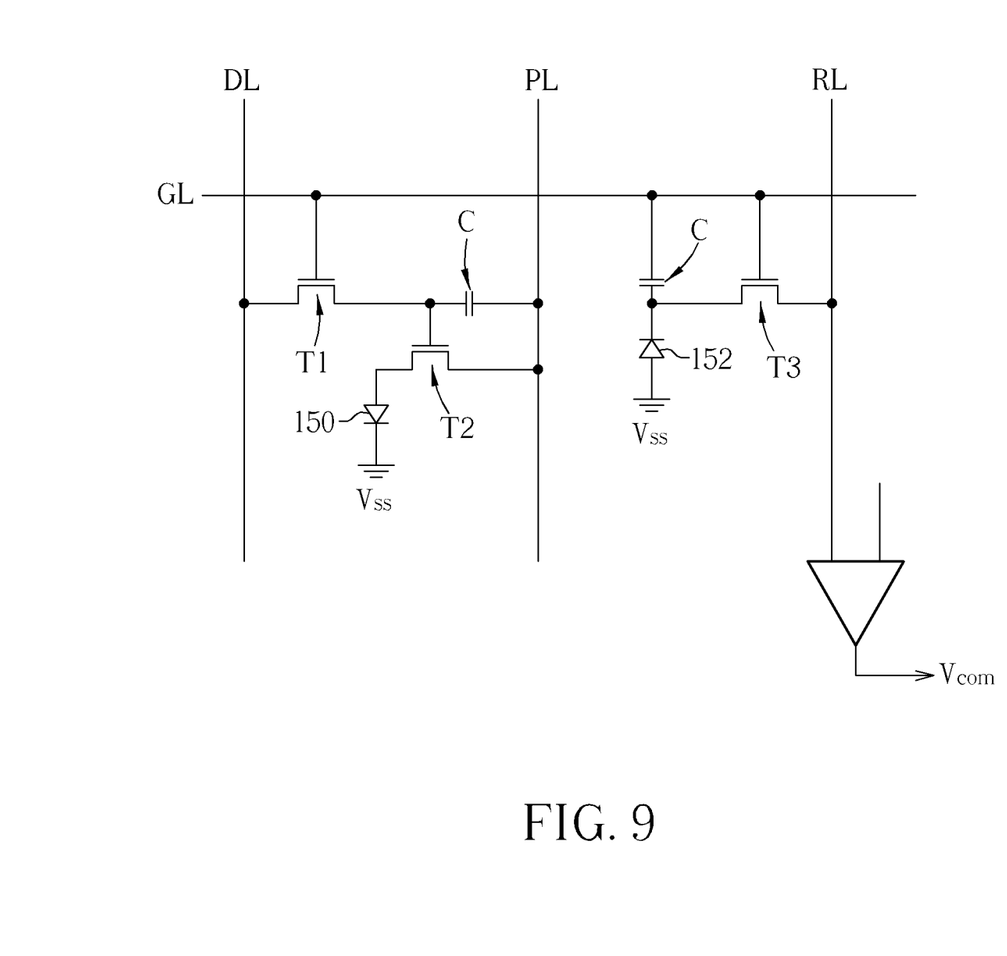
FIG. 9 schematically illustrates an equivalent circuit of an OLED touch panel according to the present invention.

FIG. 9 schematically illustrates an equivalent circuit of an OLED touch panel according to the present invention. As shown in FIG. 9, each display region PD of the OLED touch panel includes a first thin film transistor T1 (switch TFT), a capacitance device C, a second thin film transistor T2 (drive TFT), and an OLED 150. The source electrode of the first thin film transistor T1 is connected to the data line DL, the gate electrode of the first thin film transistor T1 is connected to the gate line GL, and the drain electrode of the first thin film transistor T1 is connected to the negative electrode of the capacitance device C and the gate electrode of the second thin film transistor T2. The drain electrode of the second thin film transistor T2 and the positive electrode of the capacitance device C are connected to the internal power line PL. The source electrode of the second thin film transistor T2 is connected to the anode of the OLED 150, and the cathode of the OLED 150 is connected to the voltage Vss. The light sensing region PS includes an optical sensor 152 and a third thin film transistor T3 (readout TFT). When the light radiates on the optical sensor 152, the optical sensor 152 will generate the sensing signal which can be transmitted, by the third thin film transistor T3, to the readout line RL to control the OLED touch panel.

In conclusion, an optical touch OLED panel integrated on glass and the method of forming the same are provided in the invention. The readout thin film transistor of the light sensing region can be formed by the same processes with the drive TFT of the display region. Furthermore, the top and bottom electrode of the optical sensor of the light sensing region can be formed by the same processes with the top and bottom electrode of the OLED of the display region. As a result, the present invention can just add a step of forming the patterned sensing dielectric layer to the processes of forming an OLED panel to integrate the optical sensor into the pixel region of the OLED panel. Thus, an OLED touch panel is formed. The light sensing dielectric layer can be successively integrated into the LTPS TFT and the a-Si TFT, and it brings advantages such as having opto-electronic characteristics better than that of a general p-i-n (positive-intrinsic-negative) light sensing diode, a larger fill factor, easy adjustment of the absorptive spectrum range, and easy integration with the manufacturing processes of the display panel.

Those skilled in the art will readily observe that numerous modifications and alterations of the device and method may be made while retaining the teachings of the invention.

What is claimed is:

1. A method of forming an organic light emitting diode (OLED) touch panel, comprising:

providing a substrate, including at least a pixel region on the substrate, and including a display region and a light sensing region in the pixel region;

forming a first thin film transistor and a second thin film transistor in the display region of the substrate and in the light sensing region of the substrate respectively, wherein the second thin film transistor includes a first source/drain electrode and a second source/drain electrode;

forming a readout line on the substrate, wherein the first source/drain electrode of the second thin film transistor is electrically connected to the readout line;

forming a first conductive film on the first thin film transistor and the second thin film transistor;

patterning the first conductive film to form a first bottom electrode and a second bottom electrode, wherein the first bottom electrode and the second bottom electrode are located in the display region and in the light sensing region respectively, and the first bottom electrode and the second bottom electrode are electrically connected to the first thin film transistor and the second thin film transistor respectively;

forming a patterned organic light emitting layer on the first bottom electrode;

forming a patterned light sensing silicon-rich dielectric layer on the second bottom electrode;

forming a second conductive film on the patterned organic light emitting layer and the patterned light sensing silicon-rich dielectric layer; and patterning the second conductive film to form a first top electrode and a second top electrode so as to form an optical sensor, wherein the first top electrode and the second top electrode are located on the patterned organic light emitting layer and on the patterned light sensing silicon-rich dielectric layer respectively, and the second top electrode is electrically connected to a voltage, wherein the second source/drain electrode of the second thin film transistor is electrically connected to the second bottom electrode of the optical sensor.

2. The method of claim 1, wherein the patterned light sensing silicon-rich dielectric layer comprises a silicon-rich oxide layer, a silicon-rich nitride layer, a silicon-rich oxynitride layer, a silicon-rich carbide layer, a silicon-rich carbon oxide layer and a combination thereof.

3. The method of claim 1, wherein the step of forming the first thin film transistor and the second thin film transistor comprises:

forming a patterned polycrystalline silicon layer in the display region of the substrate and in the light sensing region of the substrate respectively;

forming a gate insulating layer to cover the substrate and each of the patterned polycrystalline silicon layers;

forming a gate electrode on the surface of the gate insulating layer on each of the patterned polycrystalline silicon layers respectively;

forming a plurality of source/drain electrodes in each of the polycrystalline silicon layers;

depositing a interlayer insulating layer to cover the gate electrodes and the gate insulating layer;

etching the interlayer insulating layer and the gate insulating layer to form a plurality of first via holes on the source/drain electrodes;

forming a patterned source/drain electrode conductive layer in the via holes and on a portion of the interlayer insulating layer;

forming a passivation layer on the patterned source/drain electrode conductive layer and on the interlayer insulating layer; and etching the passivation layer to form a plurality of second via holes on the patterned source/drain electrode conductive layer.

4. The method of claim 1, wherein the step of forming the first thin film transistor and the second thin film transistor comprises:

forming a gate electrode in the display region of the substrate and in the light sensing region of the substrate respectively;

forming a gate insulating layer to cover the gate electrodes and the substrate;

forming a patterned amorphous silicon layer and a patterned doped amorphous silicon layer on the surface of the gate insulating layer on each of the gate electrode;

forming a conductive layer on the patterned doped amorphous silicon layer;

etching the conductive layer and the patterned doped amorphous silicon layers to form a plurality of patterned source/drain electrode conductive layers and a plurality of source/drain electrodes; and forming a patterned passivation layer on the patterned source/drain electrode conductive layer.

5. The method of claim 1, wherein the first conductive film comprises a transparent conductive material, and the second conductive film comprises a metal conductive material.

6. The method of claim 1, wherein the first conductive film comprises a metal conductive material, and the second conductive film comprises a transparent conductive material.

7. The method of claim 1, wherein after the patterned organic light emitting layer is formed, the patterned light sensing silicon-rich dielectric layer is formed.

8. The method of claim 1, wherein the patterned organic light emitting layer is formed subsequent to forming the patterned light sensing silicon-rich dielectric layer.

9. The method of claim 1, wherein the step of forming the patterned organic light emitting layer comprises depositing a plurality of patterned organic light emitting films.

10. An organic light emitting diode (OLED) touch panel, comprising:

a substrate, including at least a pixel region, and the pixel region including a display region and a light sensing region;

an OLED, disposed in the display region of the substrate, comprising:

a first thin film transistor;

a first bottom electrode, electrically connected to the first thin film transistor;

a patterned organic light emitting layer, disposed on the first bottom electrode; and a first top electrode, disposed on the patterned organic light emitting layer;

a readout line, disposed on the substrate;

a second thin film transistor, including a first source/drain electrode and a second source/drain electrode, and the first source/drain electrode being electrically connected to the readout line; and an optical sensor, disposed in the light sensing region of the substrate, comprising:

a second bottom electrode, electrically connected to the second source/drain electrode of the second thin film transistor;

a patterned light sensing silicon-rich dielectric layer, disposed on the second bottom electrode; and a second top electrode, disposed on the patterned light sensing silicon-rich dielectric layer, and the second top electrode being electrically connected to a voltage.

11. The OLED touch panel of claim 10, wherein the patterned light sensing silicon-rich dielectric layer comprises a silicon-rich oxide layer, a silicon-rich nitride layer, a silicon-rich oxynitride layer, a silicon-rich carbide layer, or a silicon-rich carbon oxide layer.

12. The OLED touch panel of claim 10, wherein the first thin film transistor and the second thin film transistor comprise a low temperature polycrystalline silicon thin film transistor respectively.

13. The OLED touch panel of claim 10, wherein the first thin film transistor and the second thin film transistor comprise an amorphous silicon thin film transistor respectively.

14. The OLED touch panel of claim 10, wherein the first bottom electrode and the second bottom electrode comprise a transparent conductive material respectively, and the first top electrode and the second top electrode comprise a metal conductive material respectively.

15. The OLED touch panel of claim 10, wherein the first bottom electrode and the second bottom electrode comprise a metal conductive material respectively, and the first top electrode and the second top electrode comprise a transparent conductive material respectively.

16. The OLED touch panel of claim 10, wherein the optical sensor comprises a touch optical sensor.

17. The OLED touch panel of claim 10, wherein the optical sensor comprises an ambient light sensor (ALS).

* * * * *